United States Patent
Shudo et al.

(10) Patent No.: US 9,339,970 B2
(45) Date of Patent: May 17, 2016

(54) IMPRINT APPARATUS, AND ARTICLE MANUFACTURING METHOD

(71) Applicant: CANON KABUSHIKI KAISHA, Tokyo (JP)

(72) Inventors: Shinichi Shudo, Utsunomiya (JP); Shintarou Narioka, Utsunomiya (JP); Yukio Takabayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 509 days.

(21) Appl. No.: 13/832,988

(22) Filed: Mar. 15, 2013

(65) Prior Publication Data

US 2013/0241096 A1   Sep. 19, 2013

(30) Foreign Application Priority Data

Mar. 19, 2012 (JP) .................................. 2012-061361
Feb. 22, 2013 (JP) .................................. 2013-033219

(51) Int. Cl.

| B29C 59/00 | (2006.01) |
|---|---|
| B29C 59/02 | (2006.01) |
| G03F 7/00 | (2006.01) |
| B82Y 10/00 | (2011.01) |
| B82Y 40/00 | (2011.01) |

(52) U.S. Cl.
CPC ............... B29C 59/022 (2013.01); B82Y 10/00 (2013.01); B82Y 40/00 (2013.01); G03F 7/0002 (2013.01)

(58) Field of Classification Search
CPC ..................................................... B29C 59/022
See application file for complete search history.

(56) References Cited

U.S. PATENT DOCUMENTS

| 2006/0006580 A1* | 1/2006 | Olsson | .................. B29C 59/022 264/293 |
|---|---|---|---|
| 2009/0140458 A1 | 6/2009 | Xu et al. | |
| 2010/0059904 A1* | 3/2010 | Kasumi | ................. B29C 59/022 264/293 |
| 2011/0273684 A1* | 11/2011 | Owa | ..................... B29C 43/003 355/53 |

FOREIGN PATENT DOCUMENTS

| JP | 2011-505270 A | 2/2011 |
|---|---|---|
| JP | 2012039057 A * | 2/2012 |

* cited by examiner

*Primary Examiner* — Ryan Ochylski
(74) *Attorney, Agent, or Firm* — Rossi, Kimms & McDowell LLP (57) ABSTRACT

An imprint apparatus forms a resin pattern on a substrate by curing resin in a state where the resin on the substrate is in contact with a patterned portion of a mold. It includes: a gas supply unit which supplies gas to a space between the mold and the substrate; a measuring unit which is configured so that measuring light transits the space or a space that communicates with the space, and which measures a prescribed distance between two objects using the measuring light; and a controller which obtains information concerning the prescribed distance, and which outputs a signal representing a state of concentration of the gas in the space based on the information and a measurement result of the measuring unit in a state where the gas is supplied from the gas supply unit.

11 Claims, 4 Drawing Sheets

IMPRINT APPARATUS, AND ARTICLE MANUFACTURING METHOD

BACKGROUND OF THE INVENTION

1. Field of the Invention

The present invention relates to an imprint apparatus, and to an article manufacturing method employing the same.

2. Description of the Related Art

As the demand for microfabrication of semiconductor devices or MEMS increases, not only a conventional photolithography technology but also a microfabrication technology in which an uncured resin on a substrate (wafer) is molded by a mold to thereby form a resin pattern on the substrate have been receiving attention. This technology is also referred to as an "imprint technology", by which a fine structure with dimensions of a few nanometers can be formed on a substrate. One example of imprint technologies includes a photo-curing method. With imprint apparatuses adopting this photo-curing method, first, an ultraviolet-curing resin (imprint material, photo-curing resin) is applied to a shot which is a pattern formation region on the substrate. Next, this resin (uncured resin) is molded with a mold. A resin pattern is then formed on the substrate by withdrawing the mold after the resin is cured by irradiation with ultraviolet light.

With conventional imprint apparatuses adopting the aforementioned imprint technology, it takes a long time for the resin to fill the miniature textured pattern of the patterned portion formed on the mold, and the product may be affected when filling is inadequate. So as to efficiently and satisfactorily fill the patterned portion with resin, Published Japanese Translation No. 2011-505270 of the PCT International Application discloses an imprint apparatus in which a gas (e.g., an inert gas such as helium) is supplied to an interstice between a mold and a substrate when pressing the mold (patterned portion) against the resin on the substrate. In the case where the gas that is supplied at this time is helium, the concentration of gas in the aforementioned interstice is preferably 90% or more from the standpoint of throughput and yield.

Now, even with the imprint apparatus shown in Published Japanese Translation No. 2011-505270 of the PCT International Application, it is necessary to measure the concentration of the gas supplied to the aforementioned interstice with a measuring instrument to confirm whether the gas concentration is appropriate. However, as the size of conventional measuring instruments for measuring gas concentration in an interstice in this manner is large, it is difficult to incorporate such a measuring instrument into the apparatus.

SUMMARY OF THE INVENTION

The present invention provides an imprint apparatus which is advantageous for discriminating the appropriateness of the concentration of gas that is supplied to an interstice between a mold and a substrate when pressing the mold against resin on the substrate.

According to an aspect of the present invention, an imprint apparatus which forms a resin pattern on a substrate by curing the resin in a state where the resin on the substrate is in contact with a patterned portion of a mold is provided that comprises a gas supply unit which supplies gas to a space between the mold and the substrate; a measuring unit which is configured so that measuring light transits the space or a space that communicates with the space, and which measures a prescribed distance between two objects using the measuring light; and a controller which obtains information concerning the prescribed distance, and which outputs a signal representing a state of concentration of the gas in the space based on the information and a measurement result of the measuring unit in a state where the gas is supplied from the gas supply unit.

According to the present invention, for example, it is possible to provide an imprint apparatus which is advantageous for discriminating the appropriateness of the concentration of gas that is supplied to an interstice between a mold and a substrate when pressing the mold against resin on the substrate.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

First Embodiment

Figure 1:
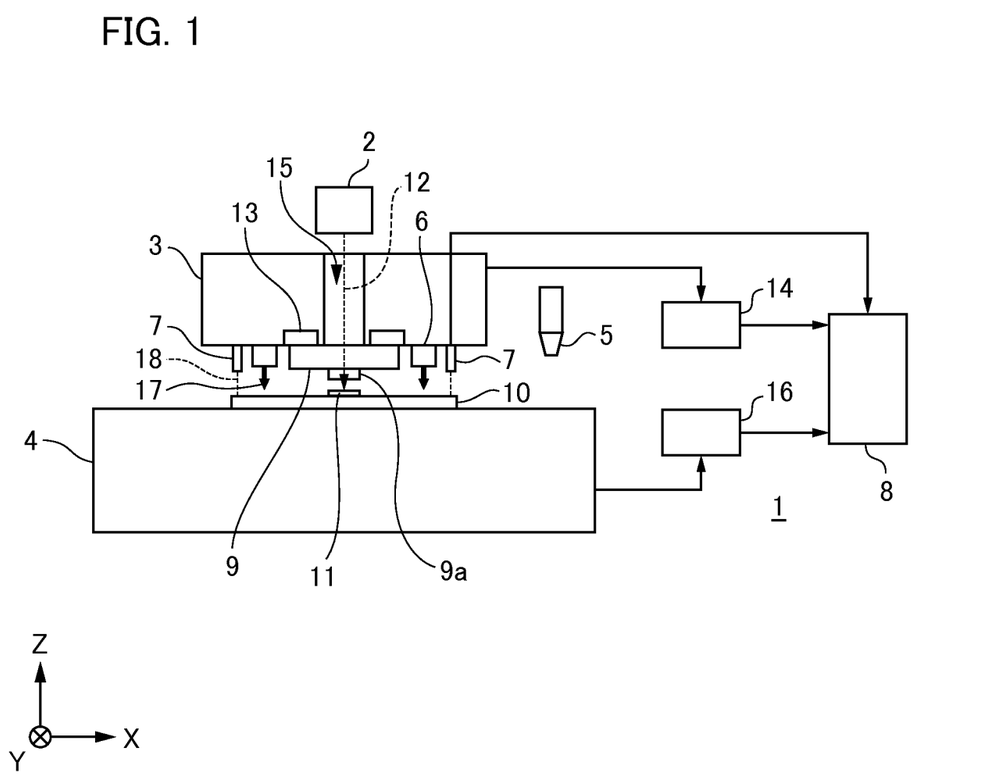
FIG. 1 is a diagram which illustrates an imprint apparatus of a first embodiment of the present invention.

Firstly, an imprint apparatus 1 of a first embodiment of the present invention is described. FIG. 1 is a schematic diagram which illustrates the configuration of the imprint apparatus 1 of the present embodiment. The imprint apparatus 1 is an apparatus which is used to manufacture devices such as semiconductor devices as articles, and which employs a mold to mold uncured resin on a wafer (on a substrate) that is a treatment substrate, and form a resin pattern on the wafer. Here, an imprint apparatus is used which adopts a photo-curing method of curing resin by irradiation with ultraviolet light. In the following drawings, a Z axis is adopted which is parallel to the optical axis of the illumination system that irradiates the resin on the wafer with ultraviolet light, and an X axis and a Y axis are adopted which mutually intersect in a plane that is perpendicular to the Z axis. The imprint apparatus 1 is first provided with an optical radiation unit 2, a mold holding mechanism 3, a wafer stage 4, a dispenser 5, a gas supply mechanism 6, a distance measuring instrument 7, and a controller 8.

The optical radiation unit 2 irradiates and cures a resin 11 on a wafer 10 with ultraviolet rays 12 through a mold 9. Although not illustrated in the drawings, this optical radiation unit 2 includes a light source unit and an optical system. The light source unit includes a light source such as a halogen lamp which generates ultraviolet rays (e.g., i-rays, g-rays), and an elliptical mirror which condenses the generated light from this light source. The optical system includes a lens or aperture and a half mirror for purposes of irradiating the resin 11 on a shot with the ultraviolet rays 12. An aperture is used for purposes of field angle control or peripheral light-shielding control. Depending on the field angle control, it is possible to irradiate only a target shot, and depending on peripheral light-shielding control, it is possible to restrict the ultraviolet rays 12 so that the ultraviolet rays 12 are not radiated beyond the contours of the wafer 10. The optical system may also be configured to include an optical integrator for purposes of uniformly illuminating the mold 9. The ultraviolet rays 12, whose range is prescribed by the aperture, are incident upon the resin 11 on the wafer 10 via the mold 9.

The peripheral form of the mold 9 is polygonal (ideally, rectangular or square), and the surface opposing the wafer 10 includes a patterned portion 9a on which a textured pattern such as a circuit pattern is 3-dimensionally formed for transfer. There are a variety of pattern sizes according to the articles to be manufactured, but miniature patterns on the order of several tens of nanometers are included. The material of the mold 9 is capable of transmitting the ultraviolet rays 12, and preferably has a low coefficient of thermal expansion—for example, quartz can be used. Furthermore, with respect to the surface of the mold 9 that is irradiated by the ultraviolet rays 12, the planar form may be circular, and may have a cavity of a certain depth.

The mold holding mechanism (mold holding unit) 3 has a mold chuck 13 which holds the mold 9, a mold drive mechanism (not shown) which movably holds this mold chuck 13, and a magnification correction mechanism (not shown) which correct the form of the mold 9 (patterned portion 9a). The mold chuck 13 is capable of holding the mold 9 by attracting a peripheral region of the surface of the mold 9 that is irradiated with the ultraviolet rays 12 by vacuum adsorption or electrostatic adsorption. In the case where, for example, the mold 9 is held by vacuum adsorption, the mold chuck 13 is connected to a vacuum pump (not illustrated in the drawings) that is set up outside the apparatus, and the adsorptive force (holding force) vis-à-vis the mold 9 can be adjusted by suitably adjusting adsorptive pressure by evacuating this vacuum pump. The mold drive mechanism moves the mold 9 in the respective axial directions so as to selectively conduct pressing of the mold 9 against the resin 11 on the wafer 10 or separation of the mold 9 therefrom. As a power source that can be adopted by this mold drive mechanism, there is, for example, a linear motor or an air cylinder. The mold drive mechanism may be composed from a plurality of drive systems such as a coarse motion drive system and a micromotion drive system in order to satisfy highly precise positioning of the mold 9. Furthermore, the mold drive mechanism may also have a configuration in which there are position adjustment functions not only in the Z axis direction, but also in the X axis direction or Y axis direction or a e (rotation around the Z axis) direction, a tilt function that serves to correct an inclination of the mold 9, and so on. Now, during driving by the mold drive mechanism, the position of the moving portion including the mold chuck 13 (mold 9) is measured by a first measuring unit 14. As this first measuring unit 14, one may adopt, for example, an encoder, a magnescale, an interferometer, an eddy current displacement meter, an electrostatic capacitance sensor, or the like. The respective operations which conduct pressing and separation in the imprint apparatus 1 may be accomplished by moving the mold 9 in the Z axis direction, but it may also be accomplished by moving the wafer stage 4 in the Z axis direction, or by conducting relative movement of these two. The magnification correction mechanisms are set up on the holding sides of the mold 9 in the mold chuck 13, and correct the form of the mold 9 (patterned portion 9a) by mechanically imparting external force or displacement to the side faces of the mold 9. Furthermore, the mold chuck 13 and the mold drive mechanism have an aperture region 15 in the central area in the planar direction (inner side) through which the ultraviolet rays 12 cast from the optical radiation unit 2 can pass en route to the wafer 10.

The wafer 10 is, for example, a single-crystal silicon substrate, an SOI (Silicon on Insulator) substrate, or a glass substrate. Patterns of the resin 11 (a layer containing patterns) are respectively formed by the patterned portion 9a in multiple shots (patterns (hereinafter "substrate-side patterns") are already formed in a preceding step prior to conveyance to the imprint apparatus 1) on this wafer 10.

The wafer stage (substrate holding unit) 4 has a wafer chuck (not shown) which holds the wafer 10 by attracting it by vacuum adsorption or the like, and a stage drive mechanism (not shown) which moves this wafer chuck (wafer 10). The stage drive mechanism includes a positioning mechanism which controls the position of the wafer chuck along the six axes in the same manner as the mold drive mechanism, thereby controlling the position of the wafer 10. Now, during driving by the stage drive mechanism, the position of the moving portion including the wafer chuck (the wafer 10) is measured by a second measuring unit 16. As this second measuring unit 16, one may adopt, for example, an encoder, a magnescale, an interferometer, an eddy current displacement meter, an electrostatic capacitance sensor, or the like.

The dispenser 5 is set up in the vicinity of the mold holding mechanism 3, and applies the resin (uncured resin) 11 to shots (substrate-side patterns) as pattern formation regions existing on the wafer 10. This resin 11 is ultraviolet curing resin (photo-curing resin, imprint material) which has the property of curing upon incidence of the ultraviolet rays 12, and is suitably selected according to the various conditions such as a semiconductor device manufacturing process.

The gas supply mechanisms (gas supply units) 6 supply the gas 17 to a space (an interstice) between the mold 9 and the wafer 10 during pressing of the mold 9 against the resin 11 on the wafer 10. This gas supply mechanism 6 includes a supply nozzle for supplying (discharging) the gas 17, and the supply nozzle is set up in the vicinity of a side face of the mold 9. The gas 17 which is supplied by the gas supply mechanisms 6 is preferably a gas other than air that has excellent diffusability and solubility, and that promotes filling of the cavity of the patterned portion 9a with the resin 11. For example, helium gas may be adopted as this gas 17.

The distance measuring instrument (measuring unit) 7 is, for example, an interferometer including a light receiving/transmitting unit installed in the mold holding mechanism 3 so that it is near the mold 9 or the wafer 10, and particularly in the present embodiment so that it faces the wafer 10 side, and is vertical relative to the surface of the wafer 10. This distance measuring instrument 7 measures the distance (optical path length) to the wafer 10 by emitting light to the wafer 10 side, and by further receiving the light that is reflected back by the surface of the wafer 10. That is, the distance measuring instrument 7 is configured so that measuring light transits the space between the mold 9 and the wafer 10, or a space that communicates with the pertinent space to measure the distance between the two objects. Furthermore, in this case, it is preferable to install a plurality of distance measuring instruments 7 from the standpoint of enhancing measurement accuracy within the interstice. The distance measuring instrument 7 of the present embodiment is not limited to an interferometer, and may also be a measuring instrument that uses light, and that does not use interference.

The controller (controller) 8 is capable of controlling the operations, adjustments and the like of the various components of the imprint apparatus 1. The controller 8 is, for example, configured by a computer, is connected to the various components of the imprint apparatus 1 via circuitry, and can execute control of the various components according to a program or the like. The controller 8 of the present embodiment at least computes refractive index variations based on the distances obtained by the distance measuring instrument 7. Otherwise, the controller 8 may be integrally configured (in a shared casing) with the other parts of the imprint apparatus 1, or it may be separately configured (in a separate casing) from the other parts of the imprint apparatus 1.

Furthermore, although not illustrated in the drawings, the imprint apparatus 1 may also include an alignment measurement system which measures alignment marks formed on the wafer 10, a surface plate that is mounted on the wafer stage 4 to form a reference plane or a bridge plate that fixes the mold holding mechanism 3, and the like. In addition, although not illustrated in the drawings, the imprint apparatus 1 may also include a mold conveyance mechanism which conveys the mold 9 between the mold holding mechanism 3 and the exterior of the apparatus, and a substrate conveyance mechanism which conveys the wafer 10 between the wafer stage 4 and the exterior of the apparatus.

Next, a description is given of the imprint processing of the imprint apparatus 1. First, the controller 8 causes the substrate conveyance mechanism to mount and fix the wafer 10 on the wafer stage 4. Next, the controller 8 detects the position of the wafer 10 to a high degree of accuracy by sequentially measuring the alignment marks on the wafer 10 with the alignment measurement system while appropriately changing the position of the wafer 10 by the driving of the stage drive mechanism. The controller 8 then computes the respective transfer coordinates from the detection results, and consecutively forms patterns in the respective prescribed shots based on these computation results. As to the process of pattern formation for a given shot, the controller 8 first causes the stage drive mechanism to position the application position on the wafer 10 (the specified position of the shot) under the discharge port of the dispenser 5. Subsequently, the dispenser 5 applies the resin 11 to the shot on the wafer 10 (application step). Next, the controller 8 causes the stage drive mechanism to move and position the wafer 10 so that the shot is located at the pressing position directly underneath the patterned portion 9a. Next, the controller 8 conducts positioning of the patterned portion 9a and the substrate-side pattern on the shot, and magnification correction of the patterned portion 9a by the magnification correction mechanisms. Subsequently, the controller 8 drives the mold drive mechanism, and presses the patterned portion 9a against the resin 11 on the shot, bringing the two into contact (mold pressing step/contact step). By means of this pressing, the resin 11 fills the textured pattern of the patterned portion 9a. Otherwise, the controller 8 judges the completion of pressing by a load sensor (not shown) installed inside the mold holding mechanism 3. In this state, the optical radiation unit 2 radiates the ultraviolet rays 12 from the rear face (top face) of the mold 9 for a prescribed period of time, and cures the resin 11 by the ultraviolet rays 12 that transit the mold 9 in a curing step. After the resin 11 has been cured, the controller 8 again drives the mold drive mechanism, and separates the patterned portion 9a from the wafer 10 (mold release step). By this means, a resin pattern (layer) of three-dimensional shape imitating the textured pattern of the patterned portion 9a is formed on the surface of the shot on the wafer 10. The imprint apparatus 1 is able to form multiple resin patterns on a single wafer 10 by conducting this series of imprint operations multiple times while changing shots by driving the wafer stage 4.

In the foregoing mold pressing step, when the mold 9 is pressed against the resin 11 on the wafer 10, it is necessary that the resin 11 evenly fill the textured pattern of the patterned portion 9a. The reason for this is that when the resin 11 is cured in a state where air bubbles remain in the resin 11 that fills the interior of the textured pattern, the resin pattern formed on the shot loses the desired shape, thereby affecting the manufactured article itself such as a semiconductor device. Thus, during pressing (at least at the start of pressing), the gas 17 is supplied to the interstice between the mold 9 and the wafer 10 by the gas supply mechanisms 6 in the aforementioned manner. As a result, the concentration of the gas 17 in the interstice is high for a fixed period of time, and residual air bubbles can be effectively inhibited. In particular, from the standpoints of throughput and yield, the concentration of the gas 17 at this time is preferably 90% or more of the proportion of all gas in the interstice. Consequently, it is necessary for the controller 8 to discriminate whether the concentration of this gas 17 is 90% or more by conducting measurement using a measuring instrument. However, this is undesirable from the standpoint of installation space, because when the concentration of the gas 17 is measured using an ordinary concentration measuring instrument as heretofore, the concentration measuring instrument is of a certain size. Thus, in the present embodiment, by employing the distance measuring instrument 7 consisting of an interferometer that is installed near the interstice, the controller 8 computes a refractive index variation of the gas 17 based on measurement value obtained by the distance measuring instrument 7, and discriminates the appropriateness of the concentration of the gas 17 with reference to this refractive index variation.

In this case, the controller 8 first measures a distance (optical path, optical path length) between the measuring instrument 7 and the wafer 10 by this measuring instrument 7, before filling the interstice between the mold 9 and the wafer 10 with the gas 17 by the gas supply mechanisms 6. This value measured in advance is then stored by the controller 8 as distance-related information pertaining to a state where the gas 17 is not supplied. Next, after supplying the gas 17 to the interstice by the gas supply mechanisms 6, the controller 8 again measures an optical path 18 by the distance measuring instrument 7. At this time, the controller 8 stores the measured value as a measurement result pertaining to a state where the gas 17 is supplied. Next, the controller 8 computes the differential (refractive index variation) between the aforementioned distance-related information and the measurement result obtained here. The controller 8 then references the obtained refractive index variation to compute the concentration of the gas 17, and outputs a signal representing the obtained concentration state. For example, with respect to a measurement position, it is assumed that the value of the optical path 18 is mechanically set to 1 mm. In this instance, the refractive index variation—specifically, the differential in the optical path 18 before supply of the gas 17 and after supply of the gas 17 (after 100% filling)—is 250 nm, and a difference of 2.5 nm per 1% can occur. Therefore, the controller 8 can estimate the concentration of the gas 17 from this difference. In the case where it is discriminated that this estimated concentration is 90% or less, the controller 8 adjusts the gas supply mechanisms 6 so that it becomes 90% or more. Otherwise, it is preferable that multiple distance measuring instruments 7 be installed—specifically, in a plurality at regular positions relative to the position of the mold 9- and that the controller 8 respectively reference the measured values of the distance measuring instruments 7 to compute refractive index variations. This is in order to minimize the effects on measured values from concentration distribution, because there are cases where a distribution occurs in the concentration of the gas 17 within the interstice such as higher concentration in the vicinity of the supply nozzles. If this concentration distribution is pronounced, it is also acceptable, for example, to measure (compute) the concentration of the gas 17 in the vicinity of the center (the patterned portion 9a) in the interstice, rather than in the vicinity of the supply nozzles. Furthermore, in the case where, for example, the distance between a measuring instrument 7 and the wafer 10 at a certain measurement position before supply of the gas 17 is pre-fixed (a pre-fixed value), the controller 8 only measures distance in a state where the gas is supplied, without obtaining the aforementioned distance-related information by advance measurement. The controller 8 then uses the differential between the fixed value and the measurement result obtained in a state where the gas is supplied as the refractive index variation.

In this manner, when supplying the gas 17 to the interstice between the mold 9 and the wafer 10 by the gas supply mechanisms 6, the imprint apparatus 1 recognizes the concentration of the gas 17 using the distance measuring instruments 7 without employing a concentration measuring instrument as heretofore. Accordingly, in the case where there is limited installation space in the vicinity of the mold 9 or the wafer 10, it is possible to optimally install equipment for obtaining the concentration of the gas 17. By maintaining the concentration of the gas 17 at a fixed value or higher when the mold 9 is pressed against the wafer 10, it is possible to optimally enhance the filling properties of the resin 11 relative to the textured pattern of the patterned portion 9a formed on the mold 9.

As described above, according to the present embodiment, it is possible to provide an imprint apparatus which is advantageous for discriminating the appropriateness of the concentration of gas that is supplied to an interstice between a mold and a wafer when pressing the mold against resin on the wafer.

Figure 2A:
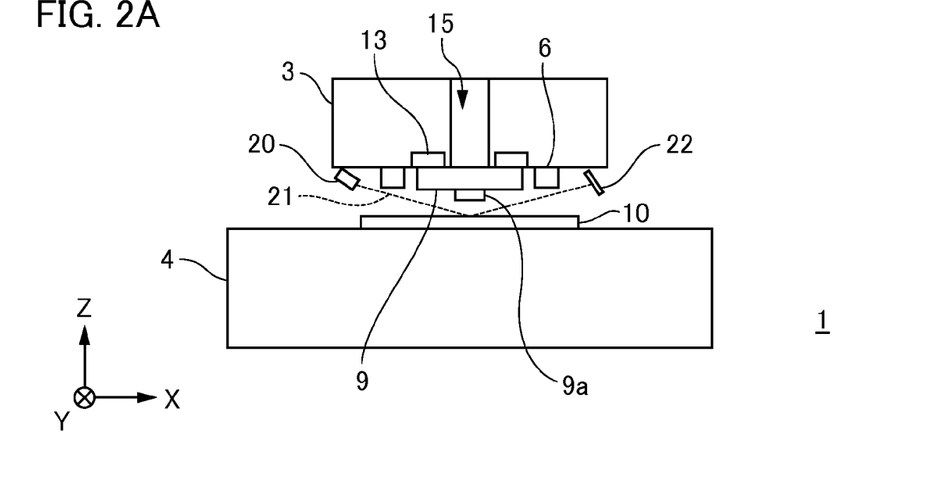
FIG. 2A is a diagram which illustrates another installation example of a distance measuring instrument of the first embodiment.
Figure 2B:
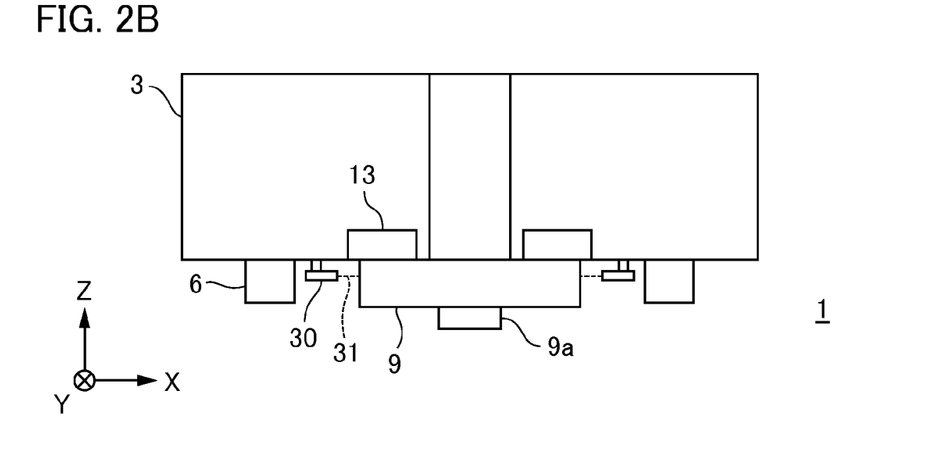
FIG. 2B is a diagram which illustrates another installation example of distance measuring instruments of the first embodiment.
Figure 2C:
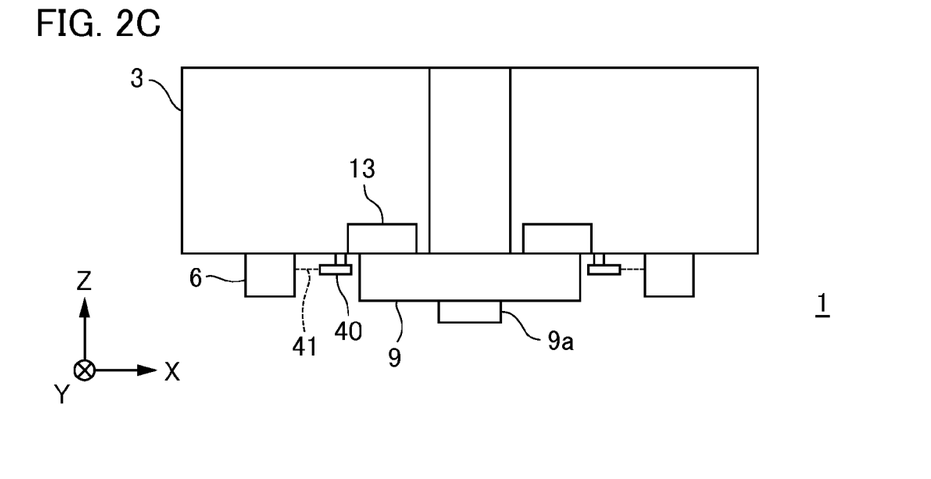
FIG. 2C is a diagram which illustrates another installation example of distance measuring instruments of the first embodiment.

In the aforementioned description, the distance measuring instrument 7 is an interferometer which is installed in the mold holding mechanism 3, and for which the optical path of measuring light is vertical relative to the wafer 10. However, the distance measuring instrument 7 of the present embodiment is not limited thereto, and distance measuring instruments for specified objects may also be adopted as shown below. FIGS. 2A-C are schematic drawings which illustrate other installation examples of the distance measuring instrument 7 in the present embodiment. In the respective drawings of FIGS. 2A-C, the same reference numbers are assigned to components identical to those shown in FIG. 1, and description thereof is omitted. First, instead of the aforementioned distance measuring instrument 7, there is a distance measuring instrument 20 shown in FIG. 2A which is an interferometer mounted onto the mold holding mechanism 3 so that an optical path 21 of measuring light is oblique relative to the wafer 10. In this case, the imprint apparatus 1 is provided with a reflecting mirror 22 at a position opposite the distance measuring instrument 20 using the patterned portion 9a of the mold 9 as reference. As shown in FIG. 2A, the measuring light is first diagonally projected from the distance measuring instrument 20 toward the wafer 10, is reflected at the wafer 10 directly underneath the patterned portion 9a, and is oriented toward the reflecting mirror 22. After being reflected by the reflecting mirror 22, the measuring light then retraces the same optical path 21, and returns to the distance measuring instrument 20.

Next, instead of the distance measuring instrument 7 using the wafer 10 as a reference for measurement, there are distance measuring instruments 30 shown in FIG. 2B which are interferometers installed in the mold holding mechanism 3, and which use the mold 9 as a reference. The gas 17 existing in the interstice heads toward the periphery of the mold 9 upon passage of a fixed period of time. In the present embodiment, the distance measuring instruments 30 are installed in spaces (regions) where this gas 17 exists. In this case, the distance measuring instruments 30 are installed in the mold holding mechanism 3 so that an optical path 31 of measuring light is vertical relative to a side face of the mold 9, and a distance (optical path differential) between the distance measuring instrument 30 and the mold 9 is measured. In particular, these distance measuring instruments 30 can be combined with a measuring instrument that is pre-installed in the imprint apparatus 1 for use in another application. For example, with an ordinary imprint apparatus, it is often the case that magnification correction mechanisms like those described above are installed near the side faces of the mold. Now, as it is also frequently the case that the imprint apparatus is provided with measuring instruments (interferometers) for measuring the amount of deformation when the mold 9 is deformed by the magnification correction mechanisms, it is possible to combine the distance measuring instruments 30 with the measuring instruments for measuring the amount of deformation of the mold 9. That is, considered in terms of the example shown in this FIG. 2B, it is possible that it may not be necessary to newly install the distance measuring instruments 30 for purposes of measuring the concentration of the gas 17.

Furthermore, instead of the distance measuring instrument 7 using the wafer 10 as a reference for measurement, there are the distance measuring instruments 40 shown in FIG. 2C which are interferometers that further modify the example of FIG. 2B, that are installed in the mold holding mechanism 3, and that use pre-installed sites in the imprint apparatus 1 as references. For example, the gas supply mechanisms 6 installed near the mold 9 can be similarly used as pre-installed sites. In this case, the distance measuring instruments 40 are installed in the mold holding mechanism 3 so that an optical path 41 of measuring light is vertical relative to the side faces of the gas supply mechanisms 6, and the distance (optical path differential) between a distance measuring instrument 40 and the side face of a gas supply mechanism 6 is measured. In particular, as this distance is a known value, the controller 8 uses a fixed value without the need for measuring a distance in advance before supply of the gas 17 by the gas supply mechanisms 6, and obtains the differential (refractive index variation) between the fixed value and the distance after supply of the gas 17.

Second Embodiment

Figure 3:
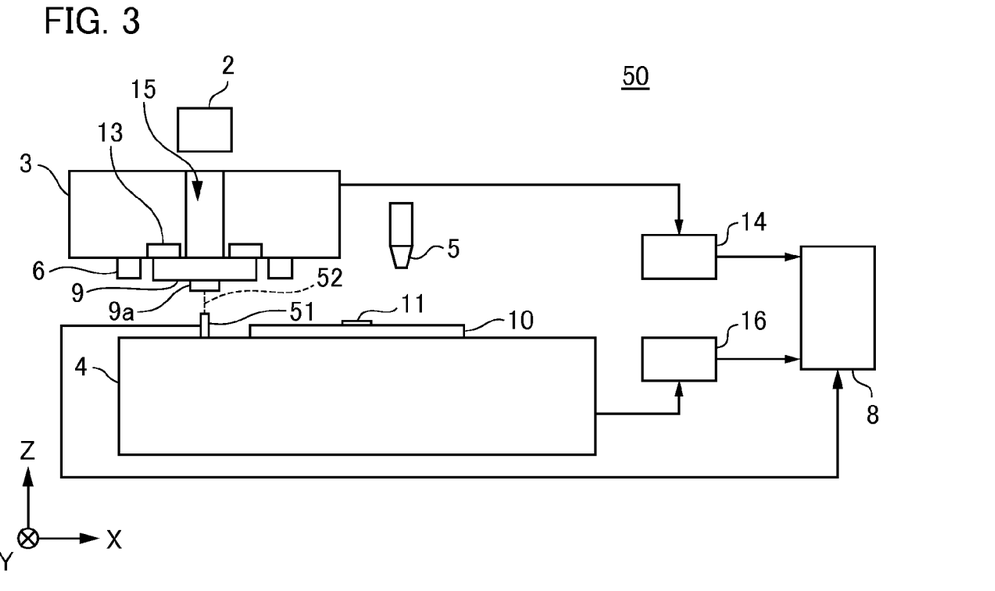
FIG. 3 is a diagram which illustrates an imprint apparatus of a second embodiment of the present invention.

Next, a description is given of an imprint apparatus 50 of a second embodiment of the present invention. The feature of the imprint apparatus 50 of the present embodiment is that the distance measuring instrument is installed on the wafer 10 (wafer stage 4) side, in contrast to the distance measuring instruments of the first embodiment which are installed on the mold 9 (mold holding mechanism 3) sides. FIG. 3 is a schematic view which illustrates the configuration of the imprint apparatus 50 of the present embodiment. In FIG. 3, the same reference numbers are assigned to components identical to those of the imprint apparatus 1 illustrated in FIG. 1, and description thereof is omitted. As shown in FIG. 3, a distance measuring instrument 51 of the present embodiment corresponding to the distance measuring instrument 7 of the first embodiment is installed on the wafer stage 4 so that an optical path 52 of measuring light is vertical relative to the mold 9. Computation of refractive index variation using this distance measuring instrument 51 is identical to that of the first embodiment, but particularly in this case, it is necessary to align the measurement positions—i.e., the positions of the mold holding mechanism 3 and the wafer stage 4—at the time of measurement by the distance measuring instrument 51. In the present embodiment, at the time of measurement by the distance measuring instrument 51, the controller 8 measures the position of the mold holding mechanism 3 (moving portion) by a first measuring unit 14, and measures the position of the wafer stage 4 (moving portion) by a second measuring unit 16, confirming that they are respectively at the same positions. By this means, the imprint apparatus 50 obtains the same effects as the first embodiment.

Third Embodiment

Figure 4:
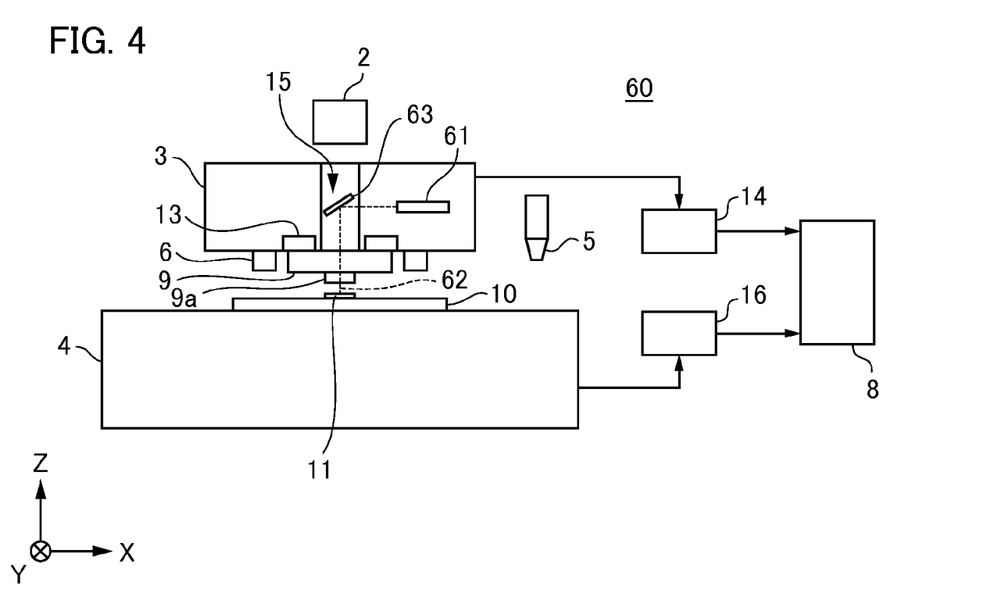
FIG. 4 is a diagram which illustrates an imprint apparatus of a third embodiment of the present invention.

Next, a description is given of an imprint apparatus 60 of a third embodiment of the present invention. The feature of the imprint apparatus 60 of the present embodiment is that the distance measuring instrument is installed inside the mold holding mechanism 3, in contrast to the distance measuring instruments of the first embodiment which are installed on the mold 9 (mold holding mechanism 3) sides. FIG. 4 is a schematic view which illustrates the configuration of the imprint apparatus 60 of the present embodiment. In FIG. 4, the same reference numbers are assigned to components that are identical to those of the imprint apparatus 1 illustrated in FIG. 1, and description thereof is omitted. A distance measuring instrument 61 of the present embodiment corresponding to the distance measuring instrument 7 of the first embodiment is installed so that an optical path 62 of measuring light is vertical relative to the wafer 10 from the interior of an aperture region 15 through which the ultraviolet rays 12 pass. In the example shown in FIG. 4, the distance measuring instrument 61 is installed so that the measuring light is oriented toward the interior of the aperture region 15, and the measuring light is directed to the wafer 10 side via a mirror 63 inside the aperture region 15. At this time, the reflected light that is reflected at the wafer 10 retraces the same optical path 62, and returns to the distance measuring instrument 61. Computation of refractive index variation using this distance measuring instrument 61 is identical to that of the first embodiment, but in this case, as well, it is preferable to align the measurement positions—i.e., the positions of the mold holding mechanism 3 and the wafer stage 4—at the time of measurement by the distance measuring instrument 61 in the same way as the second embodiment. By this means, the imprint apparatus 60 obtains the same effects as the first embodiment.

In each of the foregoing embodiments, the controller 8 ultimately recognizes the concentration of the gas 17, but computation does not necessarily have to be conducted until a specific concentration of the gas 17. For example, a method may be adopted wherein a predetermined permissible threshold value is determined in advance from a desired concentration of the gas 17, and the controller 8 moves to the next step when the refractive index variation reaches the threshold value.

Fourth Embodiment

Figure 5:
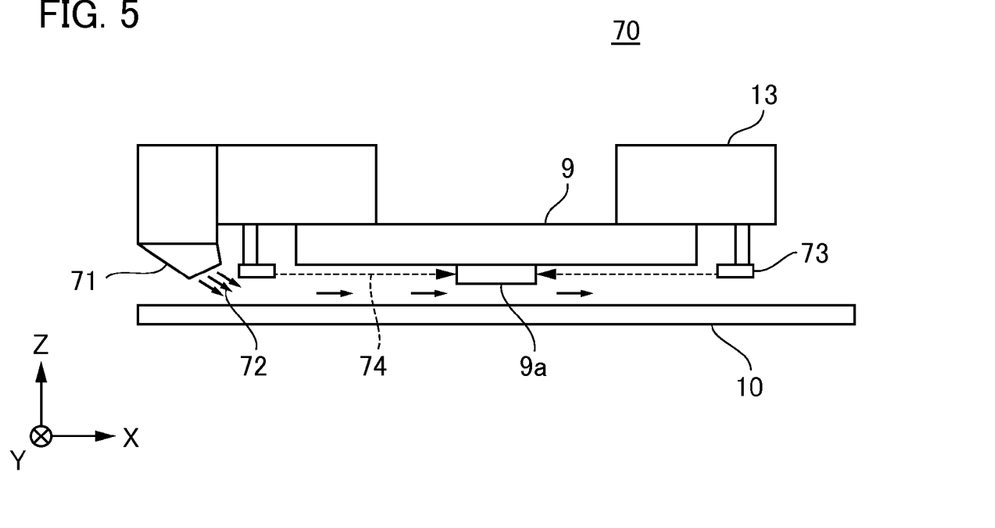
FIG. 5 is a diagram which illustrates an imprint apparatus of a fourth embodiment of the present invention.

Next, a description is given of an imprint apparatus 70 of a fourth embodiment of the present invention. The feature of the imprint apparatus 70 of the present embodiment is that a gas supply mechanism is installed on one side of the mold 9, and that distance measuring instruments are installed on both sides of the mold 9, in contrast to the first embodiment in which the gas supply mechanisms are installed on both sides of the mold 9. The gas supply mechanism is disposed on the side of the mold holding mechanism 3 that is opposite the dispenser. FIG. 5 is a schematic view which illustrates the configuration of the imprint apparatus 70 of the present embodiment. In FIG. 5, the same reference numbers are assigned to components identical to those of the imprint apparatus 1 illustrated in FIG. 1, and description thereof is omitted. As shown in FIG. 5, a gas supply mechanism 71 of the present embodiment corresponding to the gas supply mechanism 6 of the first embodiment is configured so that it is installed near a side face of the mold 9, and discharges a gas 72 from one nozzle. In addition, distance measuring instruments 73 of the present embodiment corresponding to the distance measuring instruments 7 of the first embodiment are installed on both sides of the mold patterned portion 9a so that an optical path 74 of measuring light is vertical relative to the mold patterned portion 9a. In the example shown in FIG. 5, the two distance measuring instruments 73 are installed so that the measuring light is oriented toward the two side faces of the mold patterned portion 9a, and measure the distance to a side face of the mold patterned portion 9a. While the distance measuring instruments 73 are installed on both sides of the mold patterned portion 9a in the present embodiment, at least one of the distance measuring instruments 73 may be disposed on a nozzle side of the gas supply mechanism 6 and on a side opposite the nozzle of the gas supply mechanism 6 (the downstream side of the gas flow) respectively.

The gas filling mechanism of the present embodiment is as follows. In order to instantly fill the interstice between the mold 9 and the wafer 10 with a high concentration of the gas 17, a gas supply mechanism 71 is disposed on one side of the mold 9, and discharges the gas 17 from a nozzle. The filling proceeds such that the gas 17 flows along the surface of the wafer 10 into the interstice, expelling the air to the opposite side. In the present embodiment, as distance measuring instruments 73 are disposed on both sides of the mold patterned portion 9a, the concentration in the vicinity of the patterned portion can be more optimally assessed than with the distance measuring unit of FIG. 2B which measures an end face of the mold. With this configuration, the concentration of the gas 17 first rises from the distance measuring instrument 73 near the nozzle, and the concentration measured by the distance measuring instrument 73 that is far from the nozzle subsequently rises with some delay. Fundamentally, it is better to conduct measurement of concentration at the mold patterned portion 9a, but this is difficult due to space limitations. Thus, in the present embodiment, attainment of a permissible concentration is discriminated by the two distance measuring instruments 73 sandwiching the mold patterned portion 9a via the controller 8.

In this case, the concentration is assured if the value measured by at least the distance measuring instrument 73 that is far from the nozzle on the downstream side exceeds the permissible concentration. Consequently, there is no need to directly measure the concentration of the gas that fills the mold patterned portion 9a. As a different discrimination method, it is also acceptable to compute an average value of gas concentration obtained from the measurement values of the distance measuring instruments 73 on the two sides, and conduct discrimination by considering this as the concentration attained by the mold patterned portion 9a. Ordinarily, the concentration obtained from the distance measurement value of the nozzle side is high, and the distance measurement value of the opposite side is low. By obtaining the average of these, it is possible to conduct quicker discrimination, contributing to enhancement of throughput.

Fifth Embodiment

Figure 6:
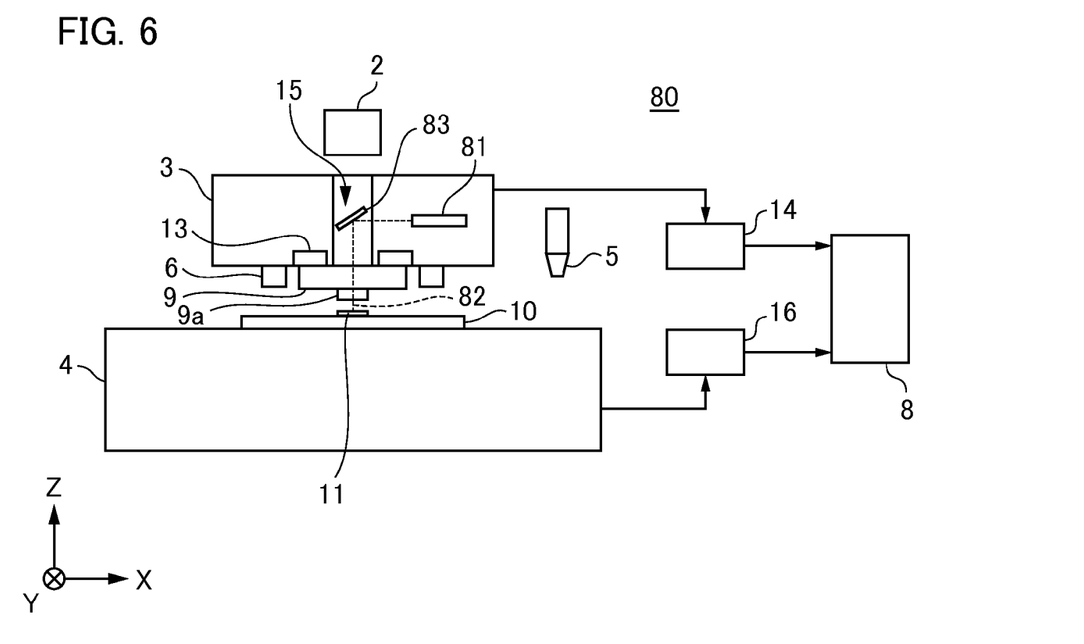
FIG. 6 is a diagram which illustrates an imprint apparatus of a fifth embodiment of the present invention.

Next, a description is given of an imprint apparatus 80 of a fifth embodiment of the present invention. The feature of the imprint apparatus 80 of the present embodiment is that measurement of concentration is conducted by a Fizeau interferometer 81 that is capable of forming interference fringes in the interstice with the wafer 10 through the mold 9, in contrast to the imprint apparatus 1 of the first embodiment that uses the distance measuring instruments 7. FIG. 6 is a schematic view which illustrates the configuration of the imprint apparatus 80 of the present embodiment. In FIG. 6, the same reference numbers are assigned to components identical to those of the imprint apparatus 1 illustrated in the first embodiment, and description thereof is omitted. The Fizeau interferometer 81 is an interferometer configured from an optical system such as an He—Ne laser light source, a collimator lens, an imaging element, or the like. The Fizeau interferometer 81 is installed so that an optical path 82 of laser light from the interior of the aperture region 15 that is transited by the ultraviolet rays 12 is vertical relative to the wafer 10. In the example shown in FIG. 6, the Fizeau interferometer 81 is installed so that the laser light of a single wavefront is oriented toward the interior of the aperture region 15, and the laser light is directed to the wafer 10 side via a switching mirror 83 inside the aperture region 15. At this time, the reflected light reflected at the wafer 10 retraces the same optical path 82, and returns to the Fizeau interferometer 81. Now, the mold patterned portion 9a is considered as a reference surface (first reflecting surface), and the surface that reflects the laser light at the surface of the wafer 10 by transmission through the mold 9 is considered as a reflecting surface (second reflecting surface). The wavefront of the optical path of these two reflecting surfaces produce interference fringes by interference. The Fizeau interferometer 81 has a function which conducts processing that incorporates the fringe images. Compared to an interference fringe in a state where the gas 17 is not supplied, and where the distance between the mold and the wafer is kept fixed, a fringe variation is generated according to the change in density of the gas 17 in an interference fringe in a state where the gas 17 is supplied. As interference fringe variation, one may cite, for example, contrast or fringe line width. By measuring this fringe variation, the gas concentration distribution in the region of the mold patterned portion 9a can be observed.

In the present embodiment, the controller 8 measures fringe variation to discriminate that a gas concentration distribution inside the region is less than a fringe variation amount corresponding to a preset concentration distribution. According to the discrimination result, if the gas concentration distribution inside the region is less than the prescribed fringe variation amount, transition to imprint exposure operation occurs by driving the switching mirror 83, and causing radiation of exposure light. It is also acceptable to combine the present embodiment and the other previously described embodiments to conduct more stable imprint, by obtaining an absolute value of concentration using the distance measuring instruments, and obtaining concentration distribution in the imprint region using a Fizeau interferometer. By measuring the concentration distribution in the imprint region in this manner, it is possible to assure satisfactory filling of the entire imprint region with the resist liquid, and minimize effects on the product.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other article such as a patterned medium (storage medium), an optical element, or the like is manufactured, the manufacturing method may include other step of processing the substrate on which a pattern has been formed instead of the etching step. The article manufacturing method of the present embodiment has an advantage, as compared with a conventional article manufacturing method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-061361 filed Mar. 19, 2012, and Japanese Patent Application No. 2013-033219 filed on Feb. 22, 2013, which are hereby incorporated by reference herein in its entirety.

What is claimed is:

1. An imprint apparatus which forms a resin pattern on a substrate by curing the resin in a state where the resin on the substrate is in contact with a patterned portion of a mold, comprising:
   a gas supply unit which supplies gas to a space between the mold and the substrate;
   a measuring unit which is configured so that measuring light transits the space or a space that communicates with the space, and which measures a prescribed distance between two objects using the measuring light; and
   a controller which obtains information concerning the prescribed distance, and which outputs a signal representing a state of concentration of the gas in the space based on the information and a measurement result of the measuring unit in a state where the gas is supplied from the gas supply unit.

2. The imprint apparatus according to claim 1, wherein the information is a measurement result of the measuring unit in a state where the gas is not supplied from the gas supply unit.

3. The imprint apparatus according to claim 1, wherein the controller computes a concentration of the gas in the space based on the information and measurement results of the measuring unit in a state where the gas is supplied from the gas supply unit, and outputs a signal representing the concentration.

4. The imprint apparatus according to claim 1, wherein the controller discriminates whether or not a concentration of the gas in the space has attained a prescribed concentration based on the information and measurement results of the measuring unit in a state where the gas is supplied from the gas supply unit, and outputs a signal representing the discrimination result.

5. The imprint apparatus according to claim 1, wherein the information is a value representing the prescribed distance, and
   the controller outputs a signal representing the state of concentration of the gas in the space based on a differential of the value and a value of a measurement result of the measuring unit in a state where the gas is supplied from the gas supply unit.

6. The imprint apparatus according to claim 1, comprising:
a mold holding unit which holds the mold; and
a substrate holding unit which holds the substrate; wherein the measuring unit is installed in the mold holding unit or the substrate holding unit.

7. An imprint apparatus which forms a resin pattern on a substrate by curing the resin in a state where the resin on the substrate is in contact with a patterned portion of a mold, comprising:
a gas supply unit which supplies gas to a space between the mold and the substrate;
an interferometer which projects light onto the surface of the mold and the substrate, and which detects interference fringes that are produced by light reflected by the respective surfaces; and
a controller which obtains information concerning the interference fringes, and which outputs a signal representing a state of concentration of the gas in the space based on the information and a detection result of the interferometer in a state where the gas is supplied from the gas supply unit.

8. The imprint apparatus according to claim 7, wherein the information is information that represents contrast of the interference fringes.

9. The imprint apparatus according to claim 1, wherein the gas is a gas other than air.

10. An article manufacturing method, comprising:
forming a resin pattern on a substrate using the imprint apparatus according to claim 1; and
processing the substrate on which the pattern has been formed in the forming.

11. An article manufacturing method, comprising:
forming a resin pattern on a substrate using the imprint apparatus according to claim 7; and
processing the substrate on which the pattern has been formed in the forming.

* * * * *